United States Patent [19]

Rubin

[11] Patent Number: 5,050,091
[45] Date of Patent: Sep. 17, 1991

[54] INTEGRATED ELECTRIC DESIGN SYSTEM WITH AUTOMATIC CONSTRAINT SATISFACTION

[75] Inventor: Steven M. Rubin, Portola Valley, Calif.

[73] Assignee: Electric Editor, Inc., San Jose, Calif.

[21] Appl. No.: 572,325

[22] Filed: Aug. 21, 1990

Related U.S. Application Data

[63] Continuation of Ser. No. 338,414, Apr. 11, 1989, abandoned, which is a continuation of Ser. No. 937,959, Dec. 4, 1986, abandoned, which is a continuation-in-part of Ser. No. 707,125, Feb. 28, 1985, abandoned.

[51] Int. Cl.$^5$ ............................................. G06F 15/60
[52] U.S. Cl. .................................... 364/488; 364/490
[58] Field of Search ................. 364/200, 900, 488–491

[56] References Cited

U.S. PATENT DOCUMENTS

| | | | |
|---|---|---|---|
| 4,495,559 | 1/1985 | Gelatt et al. | 364/491 X |
| 4,580,228 | 4/1986 | Noto | 364/491 |
| 4,612,618 | 9/1986 | Pryor et al. | 364/490 |
| 4,613,940 | 9/1986 | Shenton et al. | 364/491 |
| 4,615,011 | 9/1986 | Linsker | 364/491 |
| 4,630,219 | 12/1986 | DiGiacomo et al. | 364/491 X |
| 4,636,965 | 1/1987 | Smith et al. | 364/491 |
| 4,686,629 | 8/1987 | Noto et al. | 364/491 |
| 4,789,944 | 12/1988 | Wada et al. | 364/488 |
| 4,831,524 | 5/1989 | Furgerson | 364/488 X |

OTHER PUBLICATIONS

Chu, Kung-Chao et al.; A Database Driven VLSI Design System, IEEE Transact on Computer Aided Design, vol. CADS, No. 1, Jan. 1986, 180–187.

Trimberger: Automating Chip Layout Spectrum (IEEE), Jun. 1982, vol. 19, No. 6, pp. 38–45.

Wederhold et al.: A Database Approach to Communication in VLSI Design, IEEE Transactions on Computer Aided Design, vol. CAD-1, No. 2, Apr. 1982, pp. 57–63.

Ousterhout, John K., "Caesar: An Interactive Editor for VLSI Layouts", *VLSI Design* (4th Quarter, 1981), pp. 34–38.

Gordon, M., "A Very Simply Model of Sequential Behaviour of nMOS", *VLSI '81*, (Aug. 1981), Academic Press (Gray, ed.), pp. 85–94.

Weste, Neil, "Virtual Grid Symbolic Layout", Best Paper, *18th Design Automation Conference* (1981 IEEE), pp. 2–10.

Williams, John D., "STICKS—A Graphical Compiler for High Level LSI Design", *Proceedings of AFIPS Conference 47* (Jun. 1978), pp. 289–295.

*Primary Examiner*—Felix D. Gruber
*Attorney, Agent, or Firm*—Townsend and Townsend

[57] ABSTRACT

An electrical design system is described which integrates many analysis and synthesis tools in an environment of top-down circuit layout. The system allows electrical design in numerous technologies, including nMOS, CMOS, bipolar, printed circuit boards and others. Technologies and analysis or synthesis tools may be added or deleted easily, and different technologies may be employed in a single design. The system includes a database manager which maintains all information regarding the design of the circuit, and which is accessed by all of the analysis and synthesis tools to enable them to examine and modify the design.

The database itself is structured as a network of electrically connected and geometrically described components. Each component in the database is considered a node, and connections among components are considered as arcs. Changes are permitted only to nodes, and constraints are imposed only upon arcs. When components are changed, the effects of the changes are propagated to surrounding components by the arcs. In this manner the database manager insures that the circuit remains properly connected throughout the design process while allowing the propagation of changes up and down the hierarchy.

11 Claims, 6 Drawing Sheets

INTEGRATED ELECTRIC DESIGN SYSTEM WITH AUTOMATIC CONSTRAINT SATISFACTION

CROSS-REFERENCE TO RELATED APPLICATION

This application is a continuation of patent application Ser. No. 07/338,414, filed Apr. 11, 1989, now abandoned; and a continuation of patent application Ser. No. 06/937,959, filed Dec. 4, 1986, now abandoned; and which is in turn a continuation-in-part of patent application Ser. No. 06/707,125, filed Feb. 28, 1985, and now abandoned.

BACKGROUND OF THE INVENTION

1. Field of the Invention

This invention relates to processes for automatically designing electrical circuits and integrated circuits. It relates particularly to a method for controlling the connectivity and geometry of circuit designs while modifying the design of such circuits.

2. Description of the Prior Art

Computer-aided electrical circuit design has existed for years and many different systems have been built. Nevertheless, as circuits become more and more complex they swamp the capabilities of less powerful design aids. Frequently changing technologies are creating a need for design aids that are not bound to rigid environments. The growing number of analysis and synthesis aids must be accommodated in the design environment.

One of the problems with today's design aids is their inability to accommodate the ever-increasing number of circuit synthesis and analysis tools that are in use. Typical design systems consist of many components. After layout, the design is post-processed by a design rule checker, a node extractor, a simulator, a static analyzer, a compacter, a test vector generator, fabrication preparation, and even experimental analysis tools such as circuit and timing verification. In addition to these post-processing steps, there are many pre-processing steps that occur before and during layout. Examples are programmable logic array (PLA) and gate-array generators, floor planning systems, cell library searching, wire routing, and many more. To design effectively, the designer needs to understand a complicated set of programs. Each program is often unrelated to other parts of the system, making user feedback difficult and cryptic.

Another aspect of design systems that is a problem for designers is the manner of interaction with the system. Textual design languages are typically used in batch environments where a textually specified circuit is compiled into a layout and plotted for the user's verification. Graphic design languages are more interactive and link the user with a graphics display for immediate visual feedback of the design as it is created. Textual design languages have the advantage that they are often more powerful than graphical languages, because textual languages tend to be easier to document, parameterize, and transport. In addition, textual design is less expensive because the need for graphic output is reduced and plotting devices may be shared. Graphic design languages, however, are typically easier to learn and faster to use in producing a circuit. These benefits result from the immediate feedback provided to the user and the closeness of graphical representations to the designed circuit compared with text. Some design systems provide both text and graphics.

Another deficiency in prior art systems is the requirement that the user choose between describing the design in a "sticks" form of circuit connectivity or a geometric form of placement. Sticks systems require that the circuit be described as a network of dimensionless components connected to each other with wires. The actual size of the components and wires is considered later when a design aid produces a layout. Geometric systems, on the other hand, treat the entire circuit as explicit areas of silicon, metal, etc. There are no components or wires, just the geometry that describes both. Sticks systems have the advantage that electrical connectivity information is available to the design aid for analysis of the circuit. The disadvantage is that the user must rely on the design aid to properly generate an efficient layout of the circuit (or must spend much additional effort describing the exact size and placement of each component). Geometric systems require less intelligence because they simply manage collections of polygons describing the circuit, without understanding their use.

Current electrical circuit design aids can be viewed in light of the above classifications. Early design aids for integrated circuits were textual and geometry based, for example, PAL, ICLIC and CIF. Many subsequent systems remained geometry based but provided graphics interfaces. Examples are ICARUS, Caesar, Chipmunk and Applicon's AGS. Geometry based systems also exist that allow both text and graphics input, for example, Daedalus/DPL, SILT and CADDS II.

Printed circuit design systems are typically graphics and connectivity based, for example, SUDS and Scald. More recently, the connectivity approach has been used as a basis for textual VLSI layout languages in EARL, ALI, Sticks & Stones and I. There are even connectivity based systems that allow text and graphics, for example, LAVA/Sedit.

A rare system combines text and graphics design with both connectivity and geometry. The Mulga system acts like a sticks system but displays and manipulates the fully instantiated geometry. It has a graphics editor and can be used textually with a superset of the C programming language.

SUMMARY OF THE INVENTION

I have developed an electrical design system which integrates many synthesis and analysis tools in an environment of top-down circuit layout. The system enables a user to design in numerous technologies, including nMOS, CMOS, bipolar, printed circuit board design, etc. Analysis and synthesis tools such as simulators, design rule checkers, etc., may be added or deleted as necessary, and technologies may be modified or new ones added as desired. In the preferred embodiment, the electrical design system is written in the C programming language and runs using the UNIX operating system.

A unique feature of the electrical design system is the model of circuit representation and modification employed. This model treats a circuit as a network of electrical components (nodes), connected by wires (arcs). Each node includes one or more ports, which are sites for arc connections, and which carry information concerning the type of arcs which are permitted to connect to that port. The arcs impose constraints upon the design of the circuit, and enable propagation of those constraints from one node to another. This organization provides a hierarchy which enables the propagation of changes throughout the database representing the circuit being designed.

To make the representation more flexible, the system uses the distinction between instance and prototype to aggregate common information about classes of objects. For example, a node instance might be a specific transistor, and such a node instance will exist for every such different transistor placed in a circuit. There is also a node prototype which exists only once to define the characteristics of all of its instances. For example, a node prototype might be a transistor which defines the characteristics of the node instances. Node prototypes have port prototypes on them which are templates for possible port instances a circuit. These port prototypes define the physical locations on the node that can be used for connection, and also the allowable arcs that may be connected. To complete the instance/prototype representation, there are arc prototypes that describe defaults for each different kind of arc.

The representation of hierarchy is done through a twist of the instance/prototype scheme. Rather than have a separate class of objects to represent cells of circuitry, the node object is extendible to handle either "primitive" or "complex" components. Whereas primitive node prototypes are defined by the technologies in which they are implemented, complex node prototypes are cells that contain other node, arc and port instances. For example, a complex node prototype might be a part of a circuit. Port prototypes on complex node prototypes are actually references to port prototypes on nodes inside the cell. This notion of "exporting" ports combines with the complex node prototype scheme to provide a uniform representation of components in a hierarchical circuit. Although the prototype objects vary in their information content, the node and port instance objects are the same regardless of whether they describe primitive or complex prototypes.

The design system has an extendible database that is built upon a network structure. There is geometric data associated with every component and wire so that correct layout can be represented. Because the database is extendible, additional structures can be stored to describe behavior, power consumption, design rules, etc. Nodes, arcs, and ports are dynamically allocated objects with pointers being used to link them together into networks. Each object has a basic set of attributes that hold vital information such as physical position and network neighbors.

The database includes libraries which contain cells. Each node in the database may be a cell or may be a primitive component described by a particular technology. All arcs are described by the technologies. Thus, a technology is simply a collection of primitive components with information about their use in a design. The nature of the nodes or components varies depending upon the technology. For example, in nMOS technology a node may be a single transistor, a contact, etc., whereas in printed circuit board design the nodes consist of packaged chips. In bipolar technology, the nodes are parts of transistors such as bases, emitters, and collectors.

By virtue of the organization of the system, a hierarchy of cells of mixed technologies may be combined to enable a designer to lay out a chip in one technology, and then treat an instance of that chip as a node in a printed circuit board cell. Additionally, the organization of my electrical design system allows analysis and synthesis tools to cross technology boundaries and provide proper information.

In the preferred embodiment, modification of circuits being designed using the system of my invention is restricted to modifications of nodes. (In other embodiments the arcs may be modified.) Depending upon the attributes of the arcs coupled to a node which is modified, the nodes at the other ends of the arcs may also be changed. The database of my design system converts any alteration to a node into a series of database changes that update all necessary parts of the circuit. Changes to the nodes, in effect, propagate along arcs and result in changes to surrounding nodes. The changes to surrounding nodes, in turn, are propagated along arcs coupled to them to still further nodes. Thus, moving a single node may cause the entire circuit to compact or spread apart.

Consistency in the database is achieved through a series of procedures. When a change to a node is requested, that change is made to the database. All rigid arcs connected to the node are then moved and then all nodes connected to those rigid arcs modified. After all rigid arcs and connecting nodes are changed, the non-rigid arcs are modified in the same manner. If a connecting node must move, but has already been moved, then that node is not further moved, but rather one of its arcs may be jogged to make the necessary correction. Once all of the nodes and arcs in a region (cell) have been modified, then the cell is checked to ascertain whether its size or ports have changed. If only the size changed, then all higher level cells with instances of the cell are changed in the same manner. If any of the ports on the cell have moved, then the entire circuit is examined to insure proper modification order. This examination begins at those cells that have been modified and proceeds hierarchically to higher levels of the circuit.

Each change made to the database originates from one of the analysis or synthesis tools. The change made, and all of the resulting changes, are preserved in a change batch in the database. Once the tool invoked finishes issuing changes, the changes in that batch are broadcast to all of the synthesis and analysis tools. The system of my invention allows top-down circuit specification to enable large portions of the design to be planned before their contents are specified. As lower level objects change, the effects of those changes are propagated from the bottom up. This allows a designer to work at any level of the design, ranging from architecture to the smallest component, yet be assured that all other aspects of the design are maintained in a consistent manner. A primary benefit of the system is the ability to continuously observe specialized information such as design rules, connectivity, etc., on the design and to maintain this information independently of the designer's changes to the circuit as it progresses.

DETAILED DESCRIPTION OF THE PREFERRED EMBODIMENTS

Introduction

Figure 1:
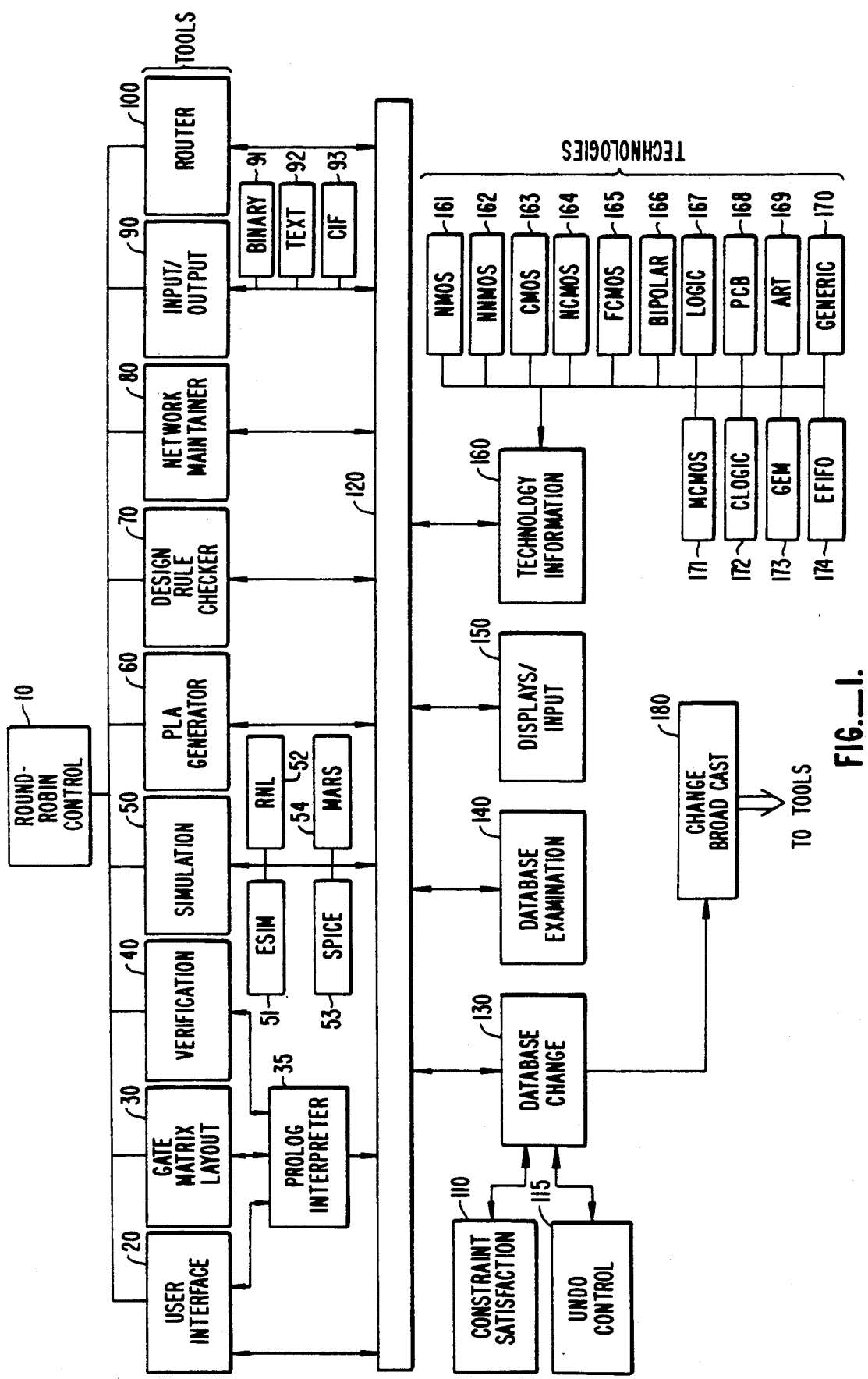
FIG. 1 is a block diagram illustrating the overall structure of a preferred embodiment of the integrated electrical design system.

The invention provides an electrical circuit automated design system which integrates any desired number of analysis and synthesis tools with multiple and mixed technologies. The system provides the ability for top-down circuit layout, and includes design rule checking and switch level simulation while enabling design using a variety of technologies. The system represents circuits as hierarchical networks of electrically-connected and geometrically-described components. The wires or "arcs" which connect individual components or "nodes" have attributes which determine what happens to the overall design when the components change.

The hierarchical layout constraints are always placed on wires. They set properties so that a change to a component (node) on either end of the wire (arc) will affect the component on the other end. In the absence of constraints, wires will rotate and stretch as necessary to connect their two components whenever either moves. Thus, an essential premise of my system is that wires always remain properly connected through all changes to the database.

A first hierarchical layout constraint is "rigidity." When applied to a wire, rigidity causes the length to remain constant and the orientation of the wire with respect to the components to be fixed. If either component connected to a rigid wire moves, then the wire and the other component will move similarly. If this other component rotates then the wire will rotate and the component on the other end will spin about the end of the wire. Mirroring of a component also causes the other rigidly connecting component to mirror. In effect a rigid wire creates a single object out of the two components that is connects. To allow for unusual constraint situations, rigidity may be set "temporarily" to allow it to override the current constraint for the next change only.

In the preferred embodiment, when a wire is not rigid, there are two other constraints that may apply: Manhattan and slidable. The Manhattan constraint forces a wire to remain at its current angle, either horizontal or vertical. If one component on a horizontal Manhattan wire moves up, then the other will also. If that component moves away to the left, however, the wire will stretch without affecting the other component. The rotation or mirroring of a component does not affect a Manhattan wire unless the wire is attached off-center, in which case a slight translation or stretch occurs.

Another non-rigid constraint that can be applied to arcs is the slidable factor which affects components with non-point connection ports. When a connection has a positive area, the wire connecting to it can slide within that area. This means that small changes to the component may not affect the wire at all because the connection area still properly contains the wire end. The slidable constraint allows the wire to make these independent movements whereas without this constraint both component and wire must move together.

Of course, connection sliding is not allowed with rigid wires, but in non-rigid cases, slidability is an optional constraint. Most layout technologies allow slidability on wires so that they may adjust to detailed changes of connection configuration.

Figure 6:
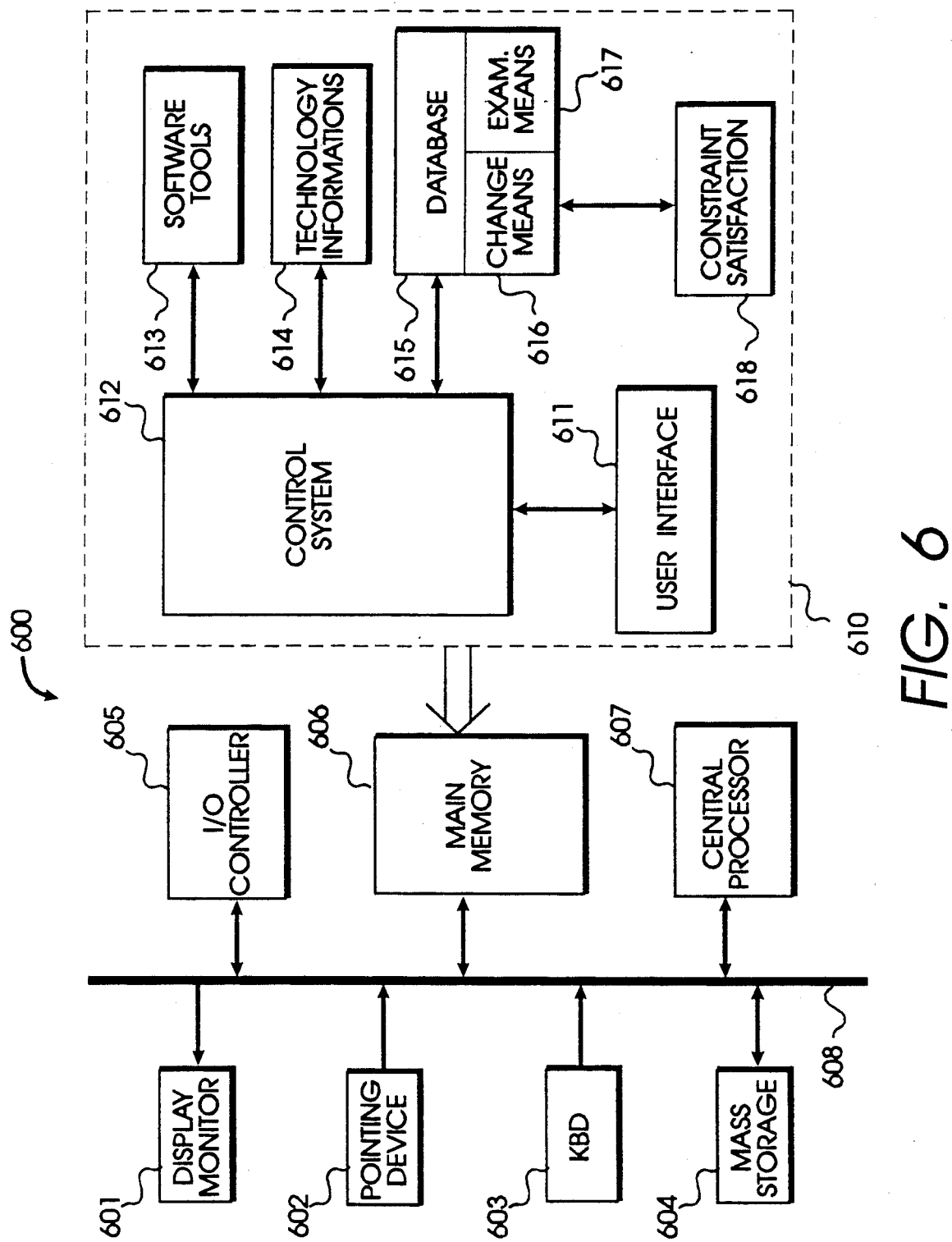
FIG. 6 is a block diagram illustrating a computer system in which the invention may be embodied.

The invention may be embodied on a computer system such as the system 600 of FIG. 6, which comprises a central processor 607, a main memory 606, a mass storage 604, a keyboard 603, a pointing device 602, a display monitor 601, and an input/output controller 605. Programming means 610, which is a software, is stored in the main memory 606. The various components communicate through a system bus 608 or similar architecture. In the preferred embodiment, an appropriately programmed UNIX workstation is used.

In operation, the user enters information (data and commands) into the keyboard 603 and/or the pointing device 602. In response, the central processor 607 executes instructions according to the programming means 610. Specifically, the information entered is processed by a user interface 611 for storage in a database 615 and for analysis by a plurality of software tools 613. Results are displayed to the user on the display monitor 611 or other output device, e.g., a plotter. A control system 612 regulates the entire process.

The database 615 further comprises a database change means 616 for updating the database 615 in response to information from the user interface 611 and a database examination means 617 for allowing examination of the information stored in the database 615. A constraint satisfaction means 618 is coupled to the database change means 616 for effecting changes to the information stored in the database 615. Further, a plurality of sets of technology information 614 is selectively connectable to the database 615 for providing interpretation of the information stored in the database 615 in response to information from the user interface 611.

Analysis and Synthesis Tools

FIG. 1 is an overall block diagram of the electrical design system of this invention. As shown, FIG. 1 includes a control 10 which is a routine in a computer program for controlling the operation of a sequence of tools 20-100. Each of the tools is coupled through a data path interconnection 120 to routines which create, revise or examine desired records of a database 130-140, display and input controls 150, and technology information 160.

Control 10, a round robin control, provides the main loop of the electrical design system of the preferred embodiment of my invention. The round robin control 10 provides each of the tools 20-100 that perform various operations with a turn at doing the particular operation performed by that tool. Some tools may be turned off, in which case they do not function incrementally and do not receive a turn. When on, a tool may examine the database and change it; the former being done by subroutine calls or direct data structure access and the latter being done exclusively by subroutine calls. My system accumulates changes made during a tool's turn and broadcasts them to all tools when the turn is over. Because of the constraint systems in the database, the actual changes may be more extensive than the requested changes, so the complete set is broadcast to every tool, including the one issuing the original changes. During the broadcast, a tool may take local action but it may not issue additional changes; these must be queued until its turn.

The user interface controls whatever input devices are coupled to the system. In the preferred embodiment, user interface 20 is connected to receive commands from a keyboard, a button on a mouse, or other well known input devices. As soon as user interface 20 receives such input signals, it will execute that command and return control of the system to control 10. Control 10 then passes control of the system to the next block, in this case the gate-matrix layout system 30. If the command from the user interface 20 requested use of the layout functions provided by gate-matrix layout 30, this layout tool will be turned on and will take a turn. If not, it will remain off and control will pass to verification system 40. Each of layout 30, verification 40, simulation 50, and PLA generator 60 is a tool which is either on or off. In the event that the tool is off, the control will pass to the next active tool. If the tool is on, round robin control 10 will pass control to that tool and allow it to perform that function. Thus, if a prior input signal to user interface 20 requested use of the gate matrix layout, the verification, simulation, or PLA generator, that tool will be turned on and will perform its complete task. For example, if verification of the circuit design has been requested at user interface 20, then verification tool 40 will be turned on and will analyze all of the paths through all of the circuitry to confirm that the circuitry designed will perform in the desired manner.

The user interface is able to do both synthesis and analysis. During its turn it waits for a single command from the keyboard or the pointing device and performs that activity. Commands can be issued as single keystrokes, button pushes on the pointing device, menu selections (fixed and pop-up), or full commands entered with parameters. The first three forms are shorthand for the last form, and dynamic binding can attach any full command to a single key, button, or menu. Combined with a parameterized macro facility, variables, and conditionals, the user interface can be configured to resemble any system that is familiar or comfortable to the user.

There are a number of different kinds of commands that can be issued by the user interface. Change commands such as "move," "create," and "undo" result in a change being sent to the database for constraint analysis and subsequent display when broadcast back. Local commands, such as the selection of a current object or a request to display a grid, affect the user interface and the screen without altering the database. The user interface relinquishes control and ends its turn even when local commands are issued.

Another class of commands are those that affect other tools. The user interface can turn on or off any tool (except itself), thus controlling the entire system. By turning off an incremental tool such as the design-rule checker, that tool will no longer examine each change that is made. Because the database tracks which cells have been changed while a tool is off, however, it will be able to catch-up when turned back on, thus acting in a batch-mode.

Many commands that appear to be standard functions of a design system are actually implemented as invocations to other tools. For example, reading and writing libraries is performed by directing the input/output tool appropriately. Simulation is done by turning on the simulator tool. These tools perform the appropriate function during their turn and then turn themselves off, thus making the command issued from the user interface appear to have been executed directly.

In addition to being very flexible and powerful, the user interface is coded in a highly modular style that permits ease of porting to any graphic display. All graphics input and output is done through a device independent subroutine package that is modeled after the SIGGRAPH Core. The package is easy to modify for new devices and currently supports many displays.

In the preferred embodiment, simulation system 50 includes four different simulators: ESIM 51, RNL 52, SPICE 53, and MARS 54, although other simulators also may be employed. Each of these simulators is well known in the computer-aided design arts, and depending upon the data supplied to the user interface, a particular one of the simulators may be selected to simulate the operation of the circuit being designed. ESIM 51 is an event-based switch level simulator written by Chris Terman at MIT which handles simulation of nMOS circuits. RNL 52 is an event-based switch level simulator for CMOS and nMOS circuits, also written by Chris Terman. SPICE 53 is a well known circuit simulator written at the University of California in Berkeley, while MARS 54 is a hierarchial switch level simulator written by Narinder Singh.

The PLA generator 60 includes a program written by Sundaravarathan R. Iyengar, which is used to generate programmable logic arrays. It is available from Case-Western Reserve University. The PLA generator allows the user to specify the Boolean function that he wishes to implement in the form of a programmable logic array (PLA), and the PLA generator automatically provides the commands to lay out a programmable logic array implementing the desired function.

Design rule checker 70 is a tool for circuit analysis which, in the case of the system shown in FIG. 1, is always on. The design-rule checker runs incrementally, checking each change as it is made to the circuit. It functions by comparing the boundaries of all polygons on new and changed components. Although this polygon comparison is required to perform very large numbers of comparisons when examining entire circuits, it is more efficient than raster-based pattern matching when checking small numbers of changes. In addition, each polygon is tied to a particular network path so that appropriate rules can be used when components are electrically connected. This makes the design-rule checker more accurate and less prone to finding spurious errors.

Another option in the design-rule subsystem is a global short-circuit detector which finds geometric connections that are not specified in the network. This is done by flattening the hierarchy and listing each polygon with a network node number. The list is then sorted to find polygon overlaps on different nets. In addition to finding short circuits, this also helps to verify network information by finding components that should be, and even appear to be connected, but are not. This part of the program was written by David Lewis at the University of Toronto.

Network maintainer tool 80 provides continuous connectivity information to the database so that all tools can use the database in immediate and rapid analysis. The network maintainer, in effect, keeps track of which components are connected to which other components.

Input/output tool 90 is normally off, and is used to read and write various disk files. Because in the preferred embodiment all of the information in FIG. 1 will be in random access memory, the disk access is necessary only to save or retrieve a library of information defining a design or to supply such information in the desired output format. Control 10 activates input/output 90, for example, in response to a command to the user interface 20. The input/output block 90 can read and write data in binary 91, text 92 and CIF format 93. Binary is the normal technique, while text is more suitable for debugging and editing. CIF is a manufacturing interface format used to produce integrated circuits.

Router 100 is a synthesis tool employed to make point-to-point connections on a single layer. Two stitching functions exist for the explicit connection of implicitly joined circuitry. The auto-stitcher looks for connection sites that adjoin or overlap geometrically and connects them explicitly. The mimic-stitcher watches user activity and duplicates it in similar situations throughout the layout. These two stitchers work incrementally, adding wires as needed.

Prolog interpreter 35 operates under control of user interface 20, gate matrix layout 30 and verification 40. The prolog interpreter provides interpretation of the prolog programming language to allow execution of program commands as they are entered. Advantageously the gate-matrix layout 30 and verification 40 routines are written in prolog.

All of the design tools are coupled to selected ones of the database change system 130, the database examination 140, display and input 150, and technology information 160 by an interconnecting network 120. In effect, network 120 provides two types of paths—those which only seek information and those which also intend to alter the state of the database. For example, design rule checker 70 is coupled through interconnecting network 120 to blocks 140-160. The design rule checker is not coupled to the database change block 130 because the design rule checker will not change the database. The design rule checker only examines and verifies the database, and thus is coupled to block 140 to examine the database, block 160 to obtain information about database objects, and block 150 to print error messages or display output signals. In a similar manner, the simulation block 50 and the network maintainer 80 are not able to effect changes in the database.

Other types of tools such as the user interface 20, the gate-matrix layout 30, the PLA generator 60, and input/output 90 are not only capable of examining the database, but also effecting changes to it. The analysis and synthesis tools are modules of subroutines that communicate with the circuit database. Each tool provides a set of routines for the database manager to use in reporting changes through block 180. A start-of-batch and an end-of-batch routine are called to delimit a batch of changes. Between these are calls to routines that report new, changed, and deleted nodes, arcs, cells, and ports.

In addition to the above routines for broadcasting changes, there is a general initialization and termination routine (called once each), a cell reexamination routine (called when the tool is turned on after having been off so that it can catch up on altered cells), and a general purpose control routine whose functions are aid-specific. Examples of generally useful but tool-specific routines are the disk I/O routines of the input-output 90 and the electrical connectivity determination routine of the design rule checker 70.

To help each tool process the design, every node, arc, and port has a reserved array of integers, one per tool. This memory location is available for use by the tool and is preserved by the system for storage of attributes describing the data object. Some tools use this integer for local record keeping and others treat it as a global attribute. In effect the array provides a set of identifiers attached to every object; a set of mini-databases managed for each tool by the central database.

An example of tool interaction will illustrate the flexibility of this approach. Assume that there are four tools: the user interface 20, the router 100, the design-rule checker 70, and the simulator 50. All but the last are on, and it is currently the user interface's turn. During its turn, the user interface 20 waits for a single command and executes it; in this case a component is created. The user interface sends this change to the database 130 and then returns control to the system. Its turn is over. The new component then is broadcast 180 to the three "on" tools so they can display it (the user interface), and queue it for further analysis (router and design-rule checker).

When the router 100 gets a turn, it examines its queue of newly created or manipulated objects and checks to see if connections are needed. Routing action is not always incremental, but it may be if desired. Any changes made are again broadcast and handled appropriately by each tool, for example, the user interface 20 displays the new wires. The router 100 knows not to examine its own changes when they are broadcast.

The next tool to run in this example is the design-rule checker 70 which looks for layout errors in the objects that have changed. All changes made by previous tools are checked and appropriate error messages are printed. Although a correcting design-rule checker is feasible to implement in my system, the current tool makes no changes. The simulator tool, being off, is skipped and control returns back to the user interface.

Once turned on, the simulator tool will receive a turn immediately. The command to start simulation completes the user interface's turn, and the absence of change causes control to progress quickly to the simulator. During its turn, the simulator will produce a netlist and/or run, depending upon the particular simulation. The final activity of the simulator is to turn itself off.

Manipulation of the Database

The database change system 130 provides a routine for changing the database. This routine is more than just altering the structure of the database because built into the database are a constraint satisfaction system 110 and an undo control 115. The constraint satisfaction system examines changes that are supplied to database change block 130 and implements additional changes. If a simple change is made through block 130, any constraint tied to that change may cause many other changes to also be made. The making of these other changes is accomplished by the constraint satisfaction system 110. The constraint system may be made modular, that is, different constraint systems may be available from a "library" with a desired one determined by the circuit designer. The undo control 115 keeps track of each change which is made to the database records to allow undoing the most recent change or changes. The number of changes which may be undone is determined by the user by an appropriate configuration of random access memory, or the writing of particular changes to disk as they are performed. Data base examination block 140 permits examination of the database by accessing of the structures that are stored in memory. In addition, subroutines are provided by the database examination block 140 which compute additional information as desired regarding the design being manipulated.

The displays/input system 150 provides several displays for the design system of this invention. Block 150 controls a color monitor display upon which all design is performed, and additionally provides a status display which displays error messages or other messages for the user of the system. The displays and input are also receptive to input signals intended for the user interface 20 to control the state of the database. The displays and input system 150 also provide system status reports by printing error messages, reading characters from the keyboard, and the like.

Technologies

Technologies provide the building blocks for the electrical design system of my invention. In addition to the primitive nodes and arcs, the technologies describe all of the functional and graphical attributes of these components for all of the analysis aids. As implemented, the technologies are embodied as collections of procedures that use internal tables. The tables are easy to modify and to create.

The technology information for use in the designs is maintained by system 160. That system provides information for the design system regarding a desired variety of technologies, although any desired technology may be incorporated. Technology information 160 provides a "real world" interpretation for each item in the database and allows the database to be independent of the technology. Thus, the mathematical representation of a node in the database may correspond to many different circuit features depending upon the particular technology in use. For example, the node could be a transistor from nMOS technology, a throughhole from printed circuit board (PCB) technology, or an emitter from bipolar technology.

As an example of the operation of the technology information, assume that network maintainer 80 receives information that a new node has been created in the database. The network maintainer will examine the database via block 140 and receive information describing the node. The network maintainer 80 is then coupled to the technology information 160 to obtain information such as the electrical conductivity of the node. Technology information block 160 switches to the appropriate one of the technologies and supplies that information back to the network maintainer 80.

Although any desired technology may be coupled to the technology information system 160, in the preferred embodiment the technologies include nMOS 161 (n-channel metal oxide semiconductor), NnMOS 162 (Northern Telecom version of nMOS), CMOS 163 (complementary MOS), NCMOS 164 (Northern Telecom CMOS), FCMOS 165 (Fairchild Camera and Instrument version of CMOS), bipolar 166, conventional logic gate technology 167, printed circuit boards 168, Art 169 (general purpose artwork technology for making figures for papers, slides, etc.), generic technology 170 (technology used to couple one technology to another). Generic technology 170 includes features such as a universal wire which electrically connects any two other points, "an invisible" wire which physically connects any two other points without electrically connecting them, as well as other features. In addition, technology information includes MCMOS 171 (MOSIS CMOS, a U.S. government research CMOS), CLOGIC 172 (the University of Calgary's version of LOGIC), GEM 173 (a non-electric planning technology which generates group element models by Amy Lansky at SRI International) and EFIDO 174 (a high level architectural digital filter technology from the University of Calgary).

Three of the more widely used technologies are discussed below—nMOS, CMOS and bipolar. N-channel metal oxide semiconductor (nMOS) technology has wires that can occur in metal, polysilicon, or diffusion. The intersection of polysilicon and diffusion forms a transistor. A transistor with depletion implant surrounding the polysilicon/diffusion intersection is a depletion transistor. Therefore, both normal (enhancement) and depletion transistors exist as primitive nodes in the nMOS technology. It is not proper to create a transistor by crossing polysilicon and diffusion wires; the transistor node must be used. This allows the system to know the functionality of the circuit more precisely, as well as preventing inadvertent transistors. If polysilicon and diffusion wires are crossed, the design rule checker 70 will issue an error message to the designer.

In addition to the transistors, the nMOS technology provides many nodes for connecting layers. There are nodes for connecting metal to diffusion, metal to polysilicon, and metal to diffusion to polysilicon. There are seven different diffusion-to-polysilicon buried contact nodes in varying configurations such as diffusion-surround and polysilicon-surround. Finally, there are support nodes for dealing with the many layers in nMOS. In addition to the three basic layers: metal, polysilicon, and diffusion, nMOS includes two types of depletion implant (hard and light), two types of enhancement implant, three types of contact (normal, oversize, and buried), and the pad opening layer (vapox or overglass). All of these layers have associated nodes to enable building arbitrary structures.

Complementary metal oxide semiconductor (CMOS) is much like nMOS except that instead of normal and depletion mode transistors working on the same signal, there are P-well and P+ transistors working on opposing signals. The P-well and the P+ are implant regions in which circuit activity takes place. Metal and polysilicon can extend into and out of these areas, but the diffusion layer is sensitive to their presence. To relieve the designer of correct implant placement, this technology provides four types of diffusion wires: diffusion, diffusion in P-well, diffusion in P+, and diffusion in both P-well and P+. Also provided are four types of metal-to-diffusion contacts and four types of diffusion pins.

The existence of nodes and arcs that include their surrounding P-well and P+ implant means that these implants never have to be explicitly described to the designer. In connecting a P-well transistor to a metal-diffusion-P-well contact, the connecting arc and both nodes will include the proper amount of P-well surround.

Fairchild Semiconductor Corporation's isoplanar integrated injection logic is one of many bipolar technologies in use today. The technology is characterized by restrictions on the interconnection of transistors and also by the unusual shapes that different transistors may have. Unlike the MOS technologies, bipolar transistors may have multiple collectors, gates, and emitters, and may share these components among multiple transistors. Thus, it is not feasible to provide a limited number of transistors as primitive nodes in the technology. Rather, the transistor must be reduced to its components to provide flexible design. The primitive transistor node is therefore an empty region of buried implant. Attached to that may be collectors, bases, and emitters of arbitrary shape. Each collector, base, and emitter has a contact so that the transistor can be wired. Bipolar technology provides two layers of metal and a "via" node for connecting them, as well as resistors.

Broadcasting of Changes Made to the Database

As each of the tools 20-100 are given turns of activity to perform their particular function, the database change system 130 maintains a record of any changes which are made to the database. If a change is made to the database during a turn, then that change will be "broadcast" to every other tool necessary before the turn is finished. Accordingly, database change system 130 controls the change broadcast system 180. When change broadcast system 180 receives a change from block 130, that change is supplied to each of the tools 20-100. Tools which are off will not receive the broadcast, while those which are on will receive it. The primary tools receiving broadcasts are the user interface 20, the design rule checker 70, and the network maintainer 80. In response, the user interface has been programmed to update the display control 150 to reflect the change made. It will update the display in response to information obtained from the database examination 140 and technology information 160.

Once design rule checker 70 receives a broadcast it queues the changes received to evaluate them. As each reaches the front of the queue, the design rule checker will examine the change, determine whether the change is acceptable or not, and print appropriate acceptance or error messages.

Typical Operation Sequence

When the electrical design system is first activated, each of tools 20-100 is given an initialization call by control 10. At this time each tool performs the pre-programmed initialization routine. For example, the user interface 20 will draw a menu on the display monitor 601. When initialization is complete, the round robin control 10 will shift control to the user interface which will wait for a command. The user may then supply signals through the monitor to indicate what is to be done.

For example, if a different technology than the default selection is desired, the user may supply an appropriate input signal to the user interface 20, to change the technology. This command does not cause a change in the database, but instead causes the user interface 20 to couple to technology information 160 and display the basic elements of the newly selected technology on the screen. The change in display will be effected by displays/input system 150. Once the change is made, control 10 will poll each of tools 30 through 100. Because the design has just commenced, all tools will be either off or disinterested in the change. Control will then return to user interface 20 to await another command.

Next, assume that the user issues a command to create a new cell, that is, a structure which did not previously exist in the database. This will pass control of the system from the user interface 20 to the database change routine 130. Because the user wishes to create the first new cell, there will be no constraints associated with its creation, and hence, the constraint satisfaction system 110 will not be invoked. The new cell will be recorded by the undo control 115, and then broadcast by block 180 to each tool. After the change is broadcast, control of the system will return to the user interface 20, which will update the screen display to provide a blank screen for creation of the new cell.

Control of the system will then be shifted by control 10 through each of the other tools which will all be off or unconcerned. Once control is returned to user interface 20, the user may enter a command, for example, instructing the system to place a transistor at a particular coordinate on the screen. For the system to carry out this instruction, technology information 160 will be retrieved, and examination of the database 140 will be required to determine where the transistor will be placed. In placing the transistor the user interface 20 will call upon the database change routine 130 to update the database. This will be broadcast by change broadcast block 180 which, when broadcast to the user interface 10 will call upon the database examination block 140 to determine if any other components must be redrawn, will call upon the displays and input system 150 to display the transistor on the screen, and will call upon the technology information block 160 to acquire the appropriate information regarding the technology in which the transistor is to be embodied.

The round robin control 10 will then shift control of the system through each of the tools. None of the tools will be active except the network maintainer 80, which will do nothing, and the design rule checker 70, which will examine the most recent change and determine whether any design rules have been violated. In the example because only a transistor has been created, no design rules will be invoked, and the design rule checker will switch off, with the round robin control eventually returning system control to the user interface 20.

To continue the example assume that the next command entered by the user is "undo." This is a request to undo the last command which was performed, in other words, a request to delete the transistor just created. In response, the user interface 20 passes control of the system to the database change routine 130 which recognizes the undo command and passes control to undo control 115. The undo control, in response, sends a change to database change system 130, providing for removal of the transistor. This is supplied to change broadcast system 180 where removal of the transistor is broadcast to all of the tools of the system. Once the user interface is informed to delete the transistor, it obtains information from examining the database via system 140 and system 160, then instructs display 150 to delete the transistor from the screen.

Next, instead of designing transistor by transistor, assume that the user wishes to invoke the PLA generator tool to design a circuit using Boolean functions. In this case the user first instructs the user interface 20 to turn on the PLA generator tool 60. This results in an instruction being transmitted to the round robin control 10 to turn on the PLA generator 60. At the same time a signal is transmitted through interconnection 120 to display/input block 150 to cause the screen to display an appropriate message. The round robin control 10 then passes control of the system to the other tools 30-100. When it gets to the PLA generator 60, the control finds that tool active and gives it a turn. Layout tool 60 then prompts the user for the equations desired. The equations are then used by the tool to generate a layout for the circuit desired. During the course of this layout, hundreds and hundreds of changes will occur. The database will be examined in block 140, technology will be retrieved via block 160, and changes made via block 130. The undo control 115 will follow each step, and each change will be broadcast to all of the tools via broadcast change block 180. Once the design is completed, the PLA generator 60 will turn itself off. The round robin control 10 will pass control of the system to the other tools as specified by the user interface 20.

The user then may wish to invoke the simulation tool 50. This is achieved in the same manner as described above. That is, user interface 20 will first receive an instruction from the operator of the system to turn on the simulation system 50. The default simulator, in the preferred embodiment ESIM 51, will be invoked. In response, the database will be repeatedly examined by system 140 in conjunction with technology information 160. Display monitor will be turned on to display or print or the status of the simulation as it runs. Once this simulation is complete, simulation block 50 will turn itself off, and control of the system will pass to the next tool.

Structure of the Database

Figure 2:
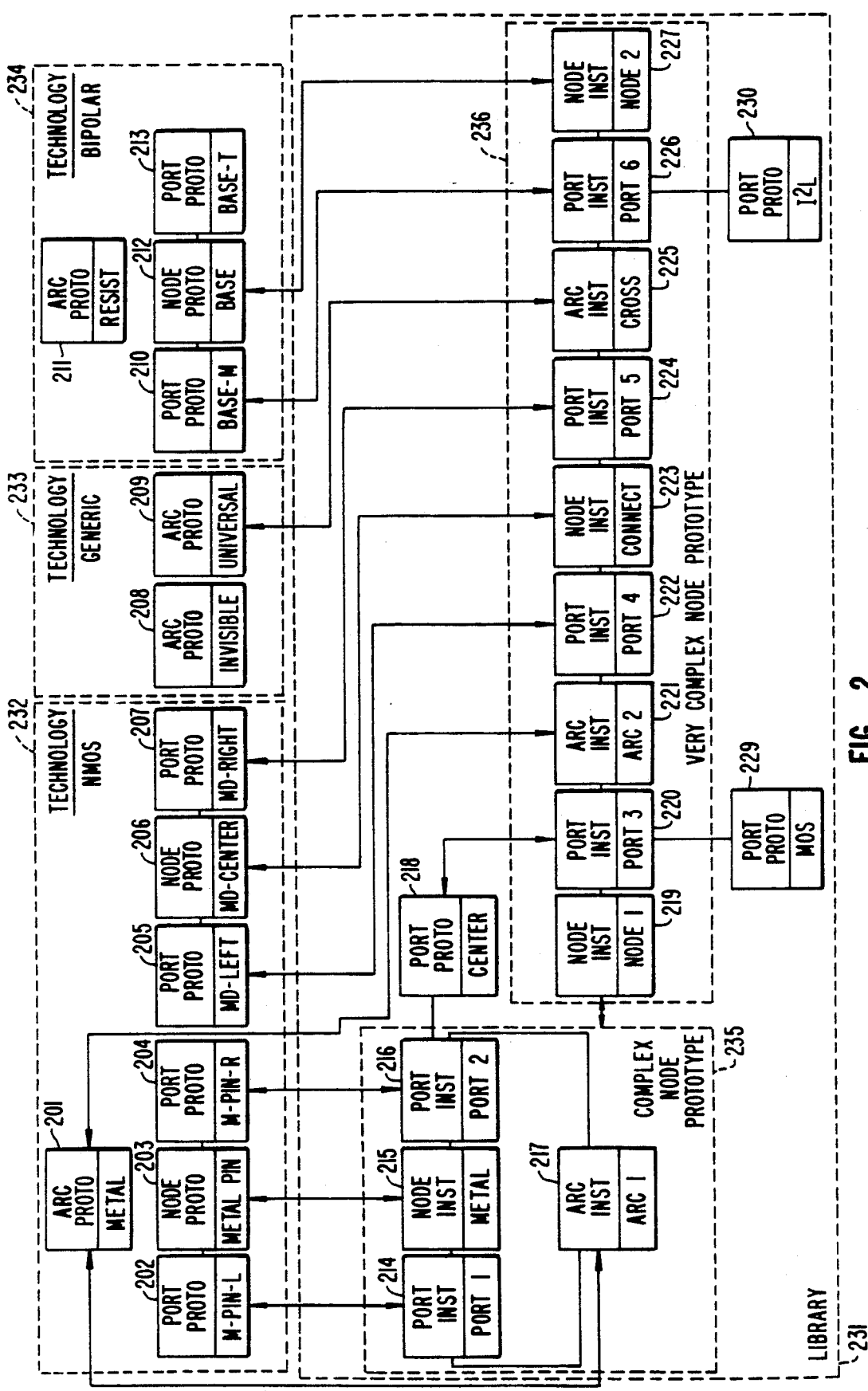
FIG. 2 is a schematic diagram illustrating the manner by which increasingly complex structures are created in the database of the electrical design system.

FIG. 2 is a block diagram illustrating the structure of the database utilized in the preferred embodiment by my electrical design system. The database consists of objects, a small subset of which are illustrated. Each object is represented by a subset of the memory of the computer upon which the system is running and each object has certain attributes. For example, a node in the circuit design may have several attributes or properties—a name, a location, and a list of connections to it. Each property will occupy a certain space in the memory of the machine, and the node may be "changed," not by moving it around in memory, but by changing the fields in the record representing the properties of that node. Because the objects in the database may be allocated from free memory space, a virtual memory system allows an almost unlimited number of objects.

The database includes nodes, arcs and ports. A node defines an object, for example, a transistor or portion thereof, a diode, a resistor, a metal pin, or the like. An arc has two and only two ends and defines a relationship between those ends. A port defines the site of an arc connection to a node. A node may have as many ports as desired. For example, a node representing a MOS transistor may be defined as having four ports to allow connections to both sides of the gate, the source, and the drain. Thus, in the structure of the database, a port is a property of a node which enables connection by an arc.

All objects within the database occur in one of two forms—prototypes and instances. A prototype is a single object which defines every instance. For example, in nMOS technology a transistor is considered a node. Stored within the database is information that defines the prototypical MOS transistor as a node prototype. Each use of the transistor in a circuit design then comprises a node instance whose meaning is ascertained by reference to the associated prototype. Storage of information concerning the node prototype provides all of the information that is common to every instance of the node, and thus need not be replicated for each instance in a circuit being designed. Each instance, in turn, represents all of the information that is specific to that particular use of the prototype, such as its location, as well as a pointer back to the prototype to provide further information. In FIG. 2, for example, block 215, is an instance of a node, a bit of metal on an integrated circuit structure. In the same manner, there are also arc prototypes and arc instances, port prototypes and port instances.

In FIG. 2 the double ended arrows provide pointers between the prototype and the instance of each object. Thus, there is an arrow between the node prototype 203 found in nMOS technology 232 and an instance of that node 215. Block 203 is the node prototype, a metal pin, for the instance of node 215. Similarly, every node prototype is also coupled to port prototypes. For example, in nMOS technology 232, node prototype 203 is coupled to port prototypes 202 and 204. Similarly, arc prototype 201, representing a metal line in nMOS technology 232, is a prototype for arc instance 217, as well as arc instance 221. Because both arc instances 217 and 221 represent a metal line in nMOS technology, both include pointers back to the same prototype 201.

At a higher level of complexity, the database includes both primitive node prototypes and complex node prototypes. The primitive prototypes provide basic building blocks which will be used at the beginning of the design. For example, in nMOS technology the MOS transistor represents a primitive node prototype. A user of the database, however, may build a larger group of objects such as depicted in block 235 to provide a new prototype. Block 235 is a "complex node prototype" which is defined by a group of lower level objects including node instances. Node prototype 235 represents a spot of metal in an integrated circuit. As shown by the arrow from complex node prototype 235 to node instance 219 in block 236, the complex node prototype 235 is itself serving as a prototype for node instance 219 in very complex node prototype 236.

The ports on a complex node prototype may be defined using port prototypes such as block 218. Block 218 is a port prototype connected to the node prototype 235 in much the same manner that primitive port prototype 204 is connected to primitive node prototype 203. In this way an instance of a port, such as instance 216, may be "exported" and thereby become available as a port prototype 218 on the node prototype 235 in which port instance 216 is situated. Thus, one may take a set of ports within a more complicated structure such as complex node prototype 235 and use them to define still more complex prototypes. The program structure does not permit complex arc prototypes.

Block 236 represents a "very complex node prototype." Block 236 includes three instances of nodes, 219, 223, and 227, and four ports, 220, 222, 224, 226. As previously explained, node instance 219 is an instance of the complex node prototype 235. The port instance 220 includes a pointer to port prototype 218 which has been exported from complex node prototype 235. Port instance 220 is connected to another port instance 222 by arc instance 221. Arc instance 221 is an instance of arc prototype 201, in other words, a metal connection. Port 222 is a port on node 223, and node 223, together with its two ports 222 and 224, are instances of node prototype 206 and port prototypes 205 and 207, respectively, which correspond to metal-diffusion (MD) contacts in nMOS technology 232. Node 227 is an instance of node prototype 212, the base region of a bipolar transistor in bipolar technology 234. The base region node prototype 212 includes a port prototype 210 of which an instance 226 is depicted. Node prototype 212 also includes a port prototype 213, which is not used in very complex node prototype 236. Thus very complex node prototype 236 represents a structure in which a region of metal represented by instance 219 is connected by a metal wire 221 to a metal-diffusion contact represented by instance 223 and by a universal wire 225 to the base of a bipolar transistor represented by instance 227. Node prototype 236 is illustrative of the complex structures which may be easily manipulated by my design system.

FIG. 2 also represents two other objects in the electrical design system database, that is, libraries and technologies. The technologies and libraries provide groupings for all of the objects in the database, particularly all node, arc and port instances and prototypes. For example, nMOS technology, partially shown in block 232, will contain all of the primitive features of nMOS technology such as a node prototype 203 comprising a metal pin, an arc prototype 201 comprising a metal line, a metal-diffusion contact 206, an nMOS transistor (not shown), a bonding pad (not shown), as well as all other necessary prototypes.

Block 234 represents a small subset of the primitive features of bipolar technology. For example, arc prototype 211 represents a resistor (such as a lightly doped polycrystalline silicon line), while node prototype 212 represents the base region of a bipolar device. Not shown in block 234, but also included in the bipolar technology, would be emitters, collectors, diodes, etc.

Block 233 represents "generic" technology which provides interconnections across technology boundaries. The subset of the generic technology depicted includes two arc prototypes termed invisible 208 and universal 209. An instance of the universal arc prototype 209 was used to connect from the port instance 224 of nMOS technology 232 to the port instance 226 of bipolar technology 234. Because each port prototype is coded with information regarding the specific arc prototypes which are permitted to connect into that port prototype, the generic technology is the only way in which the system permits connections between different technologies.

Block 231 is an example of a library and includes two primary objects, the complex node prototype 235 and the very complex node prototype 236. Initially, when my electrical design system is first activated, the technologies contain their full complement of objects, but the libraries are empty. As instances of the node, arc and port prototypes are combined to create more complex objects in the database, a library is created which contains all of the design performed at that time. A library corresponds to a disk file. Thus, when the electrical design system retrieves a file from a disk, a single library is created. Because of the pointers between the instances and the prototypes, all instances in the library will be appropriate. When changes are made to the prototypes, for example, if the characteristics of the base region prototype 212 is changed, the change is immediately available to all instances of that prototype within the library.

This provides a substantial benefit over prior art computer-aided design systems because smaller portions of the design may be independently changed without reflecting the adverse effect of that change on all instances in other parts of the design. A further explanation of the data structure, analysis and control, database change routines, and other details is presented in Appendix A which forms part of Ser. No. 707,125, incorporated herein by reference thereto.

Creation of Nodes and Arcs

The process the system employs to create nodes and arcs, to assign constraints to the arcs, and to display the design is discussed below. Assume that the user issues a command to create a new cell, that is, a complex node prototype structure which does not already exist in the database. This command passes control of the system from the user interface 20 to the database change routine 130. Because the user is creating a new cell, there are no constraints associated with its creation, and hence, the constraint satisfaction system 110 will not be invoked. To create the cell, the user issues an appropriate command and specifies "arguments" for the subroutine. This routine creates a cell having a name given by the name argument in the library specified by the library argument. The subroutine then returns the address for the data record it created defining the cell. The new cell will be recorded by the undo control 115, and then broadcast by block 180 to each tool. This broadcast is simply a call to subroutines in each tool to announce the change. Each tool has a similar routine which, if the tool is on, is called during the "broadcast" to examine the contents of the batch of changes that affect operations of that particular tool. When the change is broadcast to the user interface 20, it updates the screen display to provide a blank screen for creation of the new cell. Control of the system is then shifted by control 10 through each of the other tools which will all be off or unconcerned. (The user has not turned them on yet.)

Once control is returned to user interface 20, the user may enter a command, for example, instructing the system to place a node at a particular coordinate on the screen. For the system to carry out this instruction, the user must issue a "create" command and designate a position, for example, using a digitizer or other input device, for the transistor or other node. The user interface then reads the component specification and digitizer position by calling an appropriate subroutine. Then the user interface 20 consults the technology data objects 160 for various graphical information, again using subroutines. These routines provide information about the node, including the number of graphical polygons which comprise the node instance, and the shape of the graphical polygon to be drawn.

After this is completed, the identity and location, including transposition and orientation of the desired node instance are known. A data record for the node instance is created in memory, and the fields of the record are filled with appropriate entries for the node instance.

When a complex node prototype or complex node instance is created in the database, it is simply a record in a database and has no particular technology associated with it. Only the primitive node and arc prototypes have technologies associated with them. Data records for complex node instances all have pointers either to the primitive node prototype in a technology or to a complex node prototype. In the latter case, the complex node prototype will have pointers back to a primitive node and arc prototypes or to a complex node instance acting as a prototype. Eventually, however, all pointers point back to a primitive in a technology. Thus, all complex node instances have technologies associated with them, although different nodes in a complex node may point to prototypes in different technologies.

The new node is placed in a particular cell by supplying the parent field in the node instance data record with the address of the data record defining the cell. The address of the desired prototype for the new node is also placed in the data record. A subroutine also supplies the geometry information regarding the placement of the instance in the cell relative to other instances in the cell. This is done by a pointer to the complex node prototype. This data record has the data for the geometric fields which implement the doubly linked lists running through every object in the cell relating it to its neighbors spatially.

Assume the user now wishes to place another node in the same cell and connect the two nodes by an arc with constraints on it. Creation of the second node proceeds exactly as described above for creation of the first node. If the user creates a second node of the same type in the same cell, the data records for the two node instances will have the same pointers in their parent and prototype fields, but will have different x and y coordinates.

Constraint System

Figure 3:
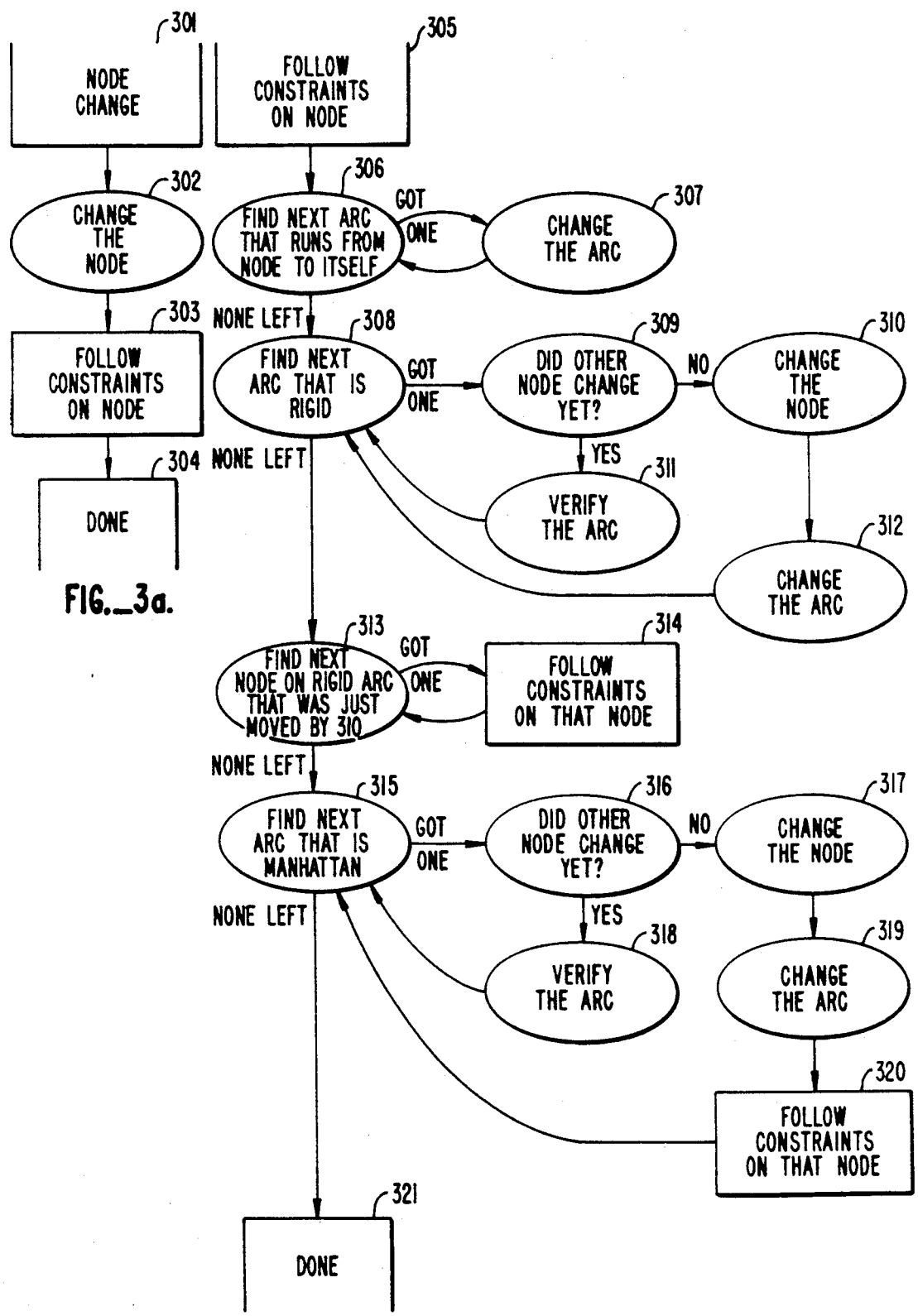
FIGS. 3a and 3b are flow charts illustrating the procedure by which constraints on a node are followed.

FIGS. 3A and 3B are a flow chart which provides further information of the manner in which the constraint satisfaction of block 110 of FIG. 1 is performed. Using the techniques described, a change to the database, such as of the type described in conjunction with FIG. 2, will result in changes to other parts of the database. In one embodiment of the electrical design system there are three types of constraints on arcs. (In another embodiment there are more and varied constraints.) First, an arc may rigidly connect two instances. If either of the instance is moved, the rigid arc will cause the other object to move through a corresponding transformation. A second type of constraint is that an arc may connect two objects in a manner such that they must remain in the same plane horizontally or vertically, but may shift in orientation with respect to each other. This type of constraint is referred to as a Manhattan constraint. The flow chart of FIG. 3 illustrates how the rigidity and Manhattan constraints are effected in my electrical design system. A third constraint is "slidable." The slidable constraint allows the position of a node to shift slightly without shifting an associated arc, if the arc is connected to a port having sufficient area to allow the shift without breaking the connection. Overall, the constraint system allows changes made to an object deep in the database to be reflected throughout the entire database at higher and higher levels. For example, a change made to the dimensions of a node instance, such as a transistor, that causes its containing cell to change size also will result in an expansion of an entire mask layout.

In another embodiment of the constraint system, linear inequality constraints are employed. This constraint system allows an arc to shrink or expand within limits specified by the definition of the constraint. For example, a given arc may be defined as always having a length greater than a specified length. Such an arc will allow the nodes to which it connects to move closer together until the minimum length is reached. Such constraint systems may be made modular in the same sense as the technologies described above. That is, the user of the system may select the constraint system appropriate for the particular design being performed.

Because satisfaction of constraints in the electrical computer-aided design system involves recursive activity, subroutines are widely used. In FIG. 3, blocks 301 and 305 are the beginning entry points of subroutines. As an example of the recursive nature of the system, the program may execute through the steps shown in FIG. 3 until it reaches block 314. At this point the program is redirected to the overall subroutine beginning with box 305 and reexecutes that subroutine. In effect, the subroutines are able to call themselves as many times as necessary.

As discussed above, the database includes nodes and arcs. The nodes represent components, with the specific component being determined by the technology in which the node prototype is found. Constraints appear on the arcs and control how two nodes connected by an arc will move in relation to each other. Because the organization of the system does not permit constraints on the nodes, all changes are made to nodes, and no changes are made to arcs. In effect the nodes are important objects, while the arcs provide the incidental constraints. If a node, for example, a transistor, is placed at a particular location, but not coupled to anything by arcs, then the node has no constraints on it, and a change to it does not compel a change to anything else in the database. On the other hand, if arcs are connected into the node and the node is changed, then the constraints on that change will propagate along the arcs to cause other changes in the database.

FIG. 3 provides a flow chart which explains how a change to a node is propagated to all other nodes directly or indirectly connected to that node. When a node is changed, execution of the program enters in block 301 and will proceed along the course of steps following block 301. When an instance of the node is changed, for example, physically moved, the database is first affected, and the representation of that node in the database is changed. This is depicted by block 302 designated "change the node." Execution of the program then proceeds to block 303 in which the program follows the constraints on the node which has been changed. When all constraints have been followed on the node, execution of the program passes to block 304 "done."

Block 303 is the subroutine call to blocks 305-321 which implement the concept of following the constraints on a node. As shown by block 306 once a node is changed the program seeks the next arc that runs from the node to itself. If one is found, that arc is changed as shown by block 307. One example of such a change is to assume that the node is a complex functional circuit which has two of its components shorted together by having an arc connected between two ports of the complex functional node. Thus, when the node is moved, the shorting arc should also be moved appropriately. These steps 306 and 307 are repeated until no arcs which run from the node to itself are found, at which time execution of the program passes to block 308.

Block 308 initiates a loop on all of the arcs which have rigid constraints applied to them. Block 308 seeks the next arc which is rigid, and if one is found, transfers execution of the program to step 309. When all rigid arcs have been found and modified in the manner of blocks 309-312, execution of the program will pass to block 313.

Once the first rigid arc is found at step 308, block 309 tests whether the node connected by that rigid arc has already been changed. If the node has not been changed, execution passes to block 310 and the node is changed. Next, as shown by block 312, the arc is changed by moving it appropriately so that it now connects the two moved nodes, and execution of the program returns to finding the next arc that is rigid, as shown by block 308. Markers are placed on each node as it is changed to enable the program to determine at block 309 whether subsequent nodes examined at that block have already been changed.

If the node at the other end of a rigid arc has already been modified, the program will pass from block 309 to block 311 to verify the arc. This step assures that the connection between the two nodes is valid before returning execution of the program to block 308. If the connection between the two nodes is invalid, an overconstrained situation has occurred in that both of the nodes have already been moved, and the constraint cannot be satisfied. If this occurs, the arc is divided into multiple pieces (place a bend in it) so that the connection may be made without moving the nodes.

Once all of the arcs that are rigid have been located and changed, execution of the program passes to block 313 to find the next node on a rigid arc that was just moved by block 310. That changed node will have arcs on it which also must be followed, and when one of these is found execution of the program passes to block 314 which recalls the subroutine beginning with block 305. Arcs running from that node to itself are then changed by blocks 306 and 307, followed by changing all rigid arcs from that node to other nodes as depicted by blocks 308-314 and changing all Manhattan arcs from that node to other nodes as depicted by blocks 315-321. Eventually execution of the program will return to block 313 of the original flow of control to locate the next node on a rigid arc that was moved at step 310. In this manner the organization of the program allows movement of all the immediate rigid constraints on an object before the program goes further. This allows a clearer organization of the propagation of changes from the lowest levels to the highest.

Once all of the rigid arcs moved by the change made at block 310 have been located, execution of the program will pass to block 315 to seek the Manhattan arcs. In a corresponding manner to that described in conjunction with blocks 308-312, the program execution, at blocks 315-320, will consider each Manhattan arc. After each arc is changed at block 319, the constraints on that node will be followed at block 320, in effect returning operation of the program to block 305 to eventually pass through each of blocks 306, 308, 313 and 315. Once the last Manhattan arc has been found and changed, all arcs and nodes coupled to the originally corrected node will have been adjusted appropriately.

Propagation of Changes Hierarchically

Figure 4:
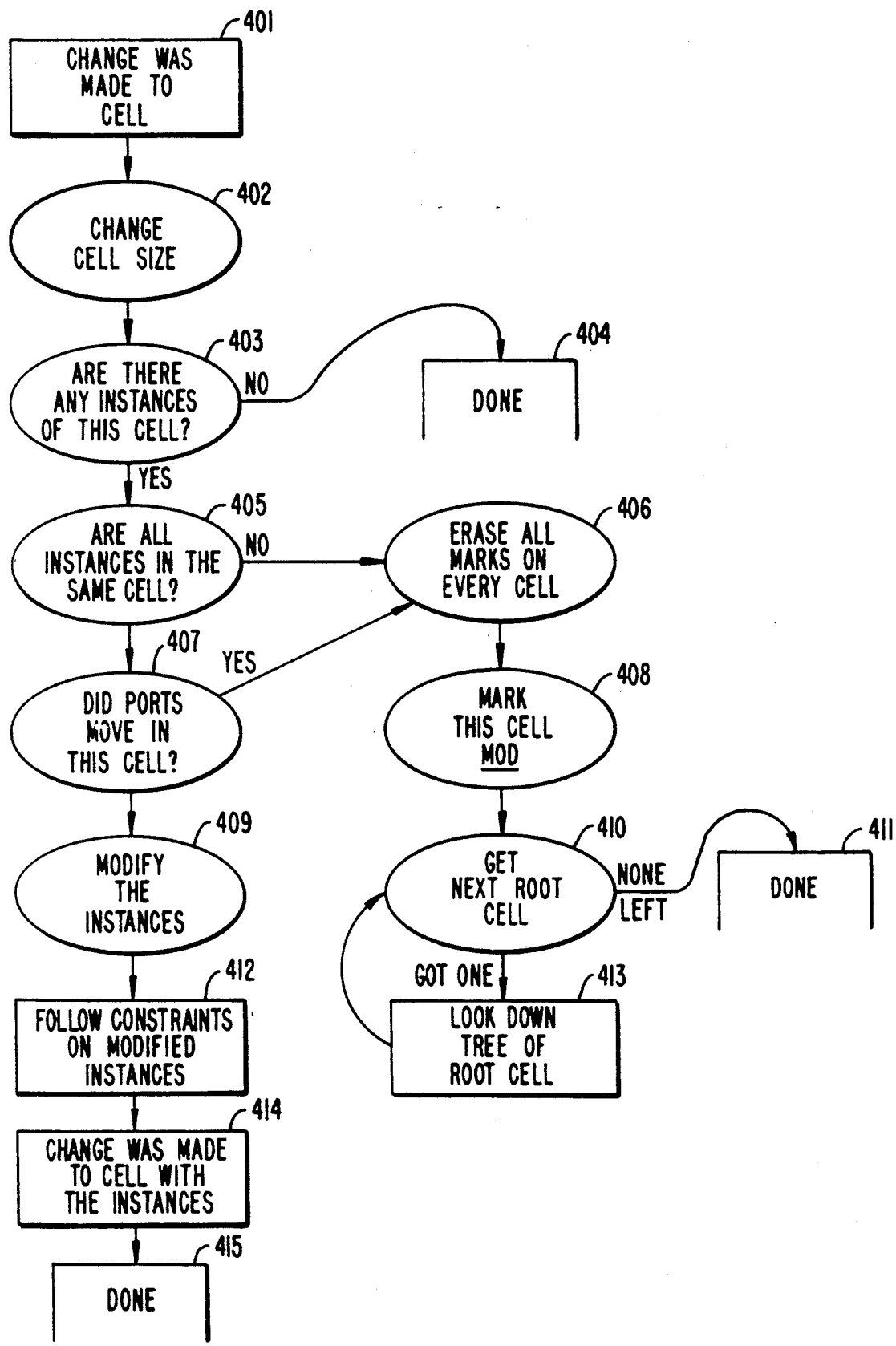
FIG. 4 is a flow chart illustrating the manner in which changes are made to cells.

FIG. 4 is a flow chart further illustrating the detailed implementation of the constraint satisfaction block 110 in FIG. 1. In a corresponding manner to that described in FIG. 3, because of the recursive nature of the constraint satisfaction routines of the electrical design system, FIG. 4 is shown as a subroutine which may be called by itself or by other subroutines. FIG. 4 is the main subroutine which is called after changes are made. As discussed in conjunction with FIG. 1, during each design tool's round robin turn, each is allowed to make changes to the database. As explained, FIG. 3 illustrates the effect of a single change to a single object, and shows how arcs are traversed and the properties on these arcs are evaluated to determine what other changes are necessary.

Once these changes have been made, however, they must be propagated hierarchically up the network. For example, if a transistor inside a cell is moved to the left, that may result in many other changes within the cell, such as the movement of an electrical contact. There is, however, a more global effect which may be caused and that is that the cell itself may be duplicated somewhere else in the design, and because of the motion of the particular transistor within the prototype cell, all of the transistors and all of the instances will also be moved. In one of those other cells there may be an arc (wire) connected to the transistor and that arc's connection site will move as well. Thus, once all of the detailed changes are done and all of the constraints of FIG. 3 are followed, the logic diagram of FIG. 4 is followed to implement the hierarchical propagation. The flow chart of FIG. 4 is called by the making of a change to a collection of objects, or cell. The subroutine shown in FIG. 4 is called for each cell in which any contents were modified by the operations described in conjunction with FIG. 3.

Once a cell is changed the first step which is performed is to change the cell size as shown by block 402. Program execution then passes to block 403 to determine whether there are any other instances of the changed cell. In the event that there are none, the subroutine is completed as shown by block 404. In this event there is no concern with hierarchical change because there is no hierarchy above the particular cell modified.

If other instances of the cell are present, execution passes to block 405 to control additional operation. The result of the tests performed by blocks 405 and 407 is to divide the possible occurrences into two cases—a simple one and complex one. If all instances of the cell which changed are in the same higher cell, and the connection sites of this cell have not changed, a simple case is presented. For example, consider the case in which a contact connected to a transistor is the cell being changed, and the transistor is moved. If all instances of that cell are in some larger cell, execution passes to block 407. If the transistor has an exported port, however, then it motion will be detected in block 407 and the complex case is still used. Also, if all instances of the changed cell are not in the same larger cell, for example, because some are in one other type of cell and some are in another type of cell, then execution passes to block 406 and the complex case is presented.

Assuming that all instances are in the same cell and that the ports in that cell did not move, as determined by blocks 405 and 407, then each instance of the changed cell is modified by block 409. Following the modification of each instance at block 409, the constraints on each instance are followed by block 412. Block 412 calls the subroutine described in FIG. 3 (block 305) and follows each constraint within that cell. Once all of the constraints have been followed and all appropriate corrections have been made, block 414 is called. Block 414 recalls the subroutine of FIG. 4, causing the program operation to jump up the hierarchy to the next larger cell. There must only be a single larger cell containing the modified instances, or else program execution would have been transferred to the complex case beginning with block 406. Once the subroutine is called, the procedures described above are repeated at progressively higher levels of hierarchy until there are no modified instances, at which point the program reaches block 415 and operation is complete.

Turning to the more complex case, that is, that all changed instances are not in the same cell or that ports moved, it is necessary for the system to determine at what level in the hierarchy it is executing. To achieve this as the system executes the steps 406-413, which marks cells. Initially, flags are placed on every cell in the entire hierarchy. These flags are termed MOD (known to need modification) and NO MOD (known not to need modification).

The purpose of erasing all of the marks at step 406 and then re-marking the entire hierarchy is t assure that all changes to the design are made from the bottom of the hierarchy to the top, yet it is not clear when the change is made exactly where the program is operating. For example, if the current cell A is changed and there are some instances of cell A in cell B and some instances of cell A in cell C, and instances of cell C in cell B, the order in which the changes are propagated is important. In such a circumstance the system cannot change cell A and then change cell B, else it creates an error. Instead, the system must change cell A and then cell C. In this manner, by the time cell B changes, it will incorporate everything that has changed in cell C and cell A. Thus, in the complex case the entire hierarchy is marked, and hierarchical searches are performed up and down the hierarchy to find the proper order of effecting the changes. Essentially, it is necessary for the program to perform steps 409, 412 and 414, and modify all instances of the prototypical change before jumping up to the next level of hierarchy. That is, all modifications must first be performed at the lowest level of the hierarchy over the entire design, before being propagated upward.

One method of achieving this is depicted in conjunction with blocks 406, 408 and 410. First, at block 406 all marks on every cell are erased. Next, as shown by block 408, the particular cell being changed is marked with a MOD flag to indicate that this cell needs to be modified. Then the entire hierarchy is searched and cells are marked MOD if they contain an instance of another cell similarly marked or cells are marked NO MOD if they have nothing below them in the hierarchy which needs to be changed. Once all the MOD and NO MOD flags are set, the modified cells are checked as in the simple case of blocks 409, 412 and 414.

Searching of the hierarchy begins at block 410, which locates "root" cells, that is, cells that exist in other cells as instances. If no root cells remain at block 410, the process is complete as shown by block 411. If, however, a root cell is found, execution of the program shifts to block 413 to check the tree of that root cell, mark its sub-cells, and modify them as previously described. The detailed manner in which the tree of each of the root cells is examined is described in conjunction with FIG. 5.

Examination of Trees of Root Cells

Figure 5:
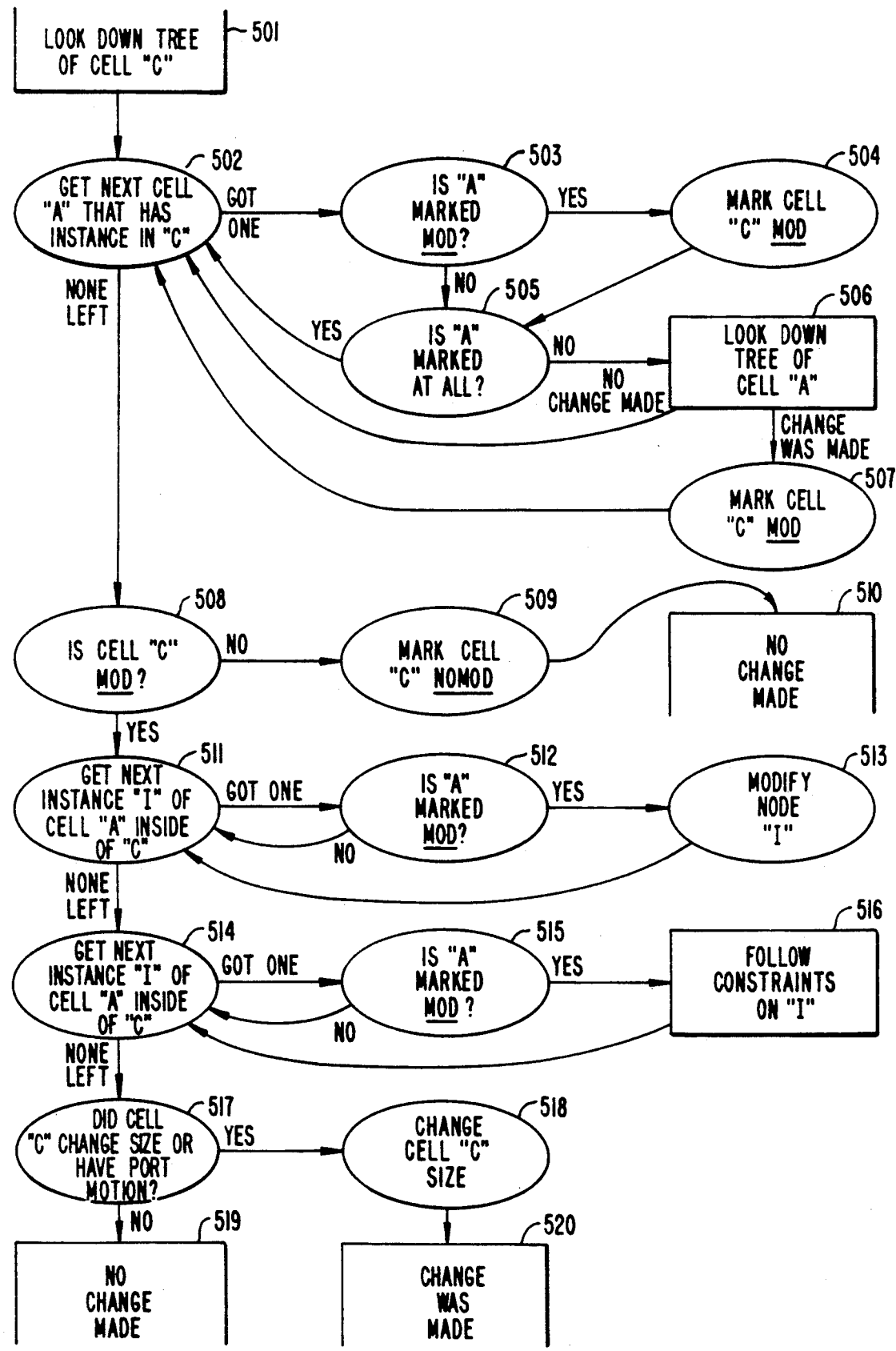
FIG. 5 is a flow chart illustrating the manner by which changes are propagated hierarchically through a design.

As shown in FIG. 5 the examination of trees of root cells includes two tasks, the first of which consists of the steps depicted in blocks 502-510. This task is to mark all of the cells in the entire hierarchy, whether modified or unmodified with NO MOD or MOD. In the second part of the task, blocks 511-520, the cells are traced through, once modified, to apply the hierarchical changes of the simple case of FIG. 4.

In block 501 the overall step performed is to look down the tree of cell C. First, the system locates the next cell A which has an instance in cell C. If none remain execution of the program shifts to block 508. If one is found at block 502, execution shifts to block 503, and cell A is examined to determine whether it is already marked as modified. If so, then the content of cell C is affected by the hierarchical change and cell C is marked as modified at block 504. In either case, execution passes to block 505 to determine whether cell A is marked at all. Block 505 is reached also after block 504 marks cell C as modified. If cell A is marked, execution of of the program passes to block 502 to get the next cell A which has an instance in C. If not, the program passes to block 506 and looks down the tree of cell A which is a recursive call to the subroutine of FIG. 5. During this pass, the cells examined will be one level below those examined in the previous pass. Again, the same tests are performed to propagate the MOD flag up the hierarchy.

During the operation of the subroutine shown in FIG. 5, flags which state whether a change was made to a cell or whether no change was made to a cell are returned. These flags are indicated by the particular block used to exit the subroutine such that blocks 510 and 519 return a "no change" flag and block 520 returns a "change" flag. The value of this flag is checked upon return of the subroutine call in block 506 which then transfers control either to block 502 or 507.

As a result of the recursive nature of the loop in blocks 502-507, by the time program execution reaches block 508 to break out of the loop that block 502 established, the entire hierarchy below the level of the present cell has been marked up to the current cell C. As shown by block 508, if cell C is not marked as modified, execution passes to block 509 in which cell C is marked as NO MOD. In effect, the system has searched the entire hierarchy below cell C and determined that no modifications were made below cell C which caused cell C to be marked as modified. Once cell C is marked NO MOD at block 509, execution passes to block 510. No change was made.

If, on the other hand, cell C is marked as modified, execution passes to block 511 in which each instance "I" of cell A inside of cell C is retrieved. As each instance is retrieved, it is checked to determine whether it has been marked as modified and if so, the modification is made by block 513 (similar to block 302). If not, execution of the program returns to block 511 to seek the next instance I of cell A inside of cell C.

Once the last instance I of cell A inside of cell C is modified, execution of the program passes to block 514, and the constraints on each modified instance I are followed by block 516. This is a call to the subroutine block 305 of FIG. 3. Once all of these instances are modified, execution of the program passes to block 517 to determine whether cell C changed size or had one or more of its ports moved. If none of these are found, no change is indicated for cell C. On the other hand, if either ports changed or the size of cell C changed, the program changes the size of cell C at block 518 and indicates this change in block 520.

In effect, there are always two steps to changing a node. First, the node must be changed, and second the constraints on the node must be followed to determine what other changes must be made. For example, in FIG. 5 once the loop of blocks 511, 512 and 513 are completed, a second loop of blocks 514, 515 and 516 are followed for every one of the instances inside of cell C. Once block 516 is reached, the constraints on cell I are followed. Once all of these constraints are followed and all the changes have been made in the right order, the test of block 517 is performed to determine whether as a result of all of the changes made any change was made to cell C which would affect any other cells in the hierarchy. If all changes have only an internal affect on cell C, then the changes to cell C are not propagated further up the hierarchy. If. cell C changed, then block 520 reports this information back to block 506 so that the instances of this cell can be properly adjusted.

The preceding has been a description of the preferred embodiment of the electrical design system of this invention. It should be understood, however, that the presence or absence of individual tools or technologies is not a feature of the invention. Tools may be added to the system as necessary, and the control system will provide each with a turn in the manner described above. Similarly, additional technologies may be implemented and added to the system to enable electrical design in technologies other than those described herein.

I claim:

1. A system for designing electrical circuits comprising:
    a computer having a memory and a processor;
    a display device coupled to said computer;
    a keyboard device coupled to said computer for entering information;
    a cursor-control device coupled to said computer for generating signals for moving a cursor on said display device; and
    programming means stored in said memory for instructing said processor to perform the steps of:
        representing alterable components of the circuit as nodes;
        representing interconnections between nodes as arcs;
        imposing constraints with regard to the design only upon the arcs;
        creating a desired set of the nodes and the arcs representative of the arcs;
        effecting a change to the circuit to thereby change at least one selected node;
        examining the constraints on the arcs coupled to the selected node, and in response effecting those changes imposed by the constraints on the arcs coupled to the selected node; and
        displaying on the display device a representation of the circuit.

2. A system for designing electrical circuits comprising:
    a computer having a memory and a processor;
    a display device coupled to said computer;
    a keyboard device coupled to said computer for entering information;
    a cursor-control device coupled to said computer for generating signals for moving a cursor on said display device;
    user interface means for supplying information to the system concerning the electrical circuit being designed;
    database means connected to the system to store the information supplied by the user interface means;
    a first plurality of tools each selectively connectable to the database means for analyzing the information stored therein;
    a control system connected to each of the first plurality of tools and to the user interface means for controlling which of the plurality of tools is connected to the database means; and
    wherein the system under control of a user employing the user interface means produces a circuit design.

3. A system as in claim 2 wherein the database means comprises:
    database change means for effecting changes to the information stored in the database in response to information from the user interface means; and
    database examination means for allowing examination of the information stored in the database.

4. A system as in claim 3 further comprising constraint satisfaction means coupled to the database change means for effecting changes to the information stored in the database means which changes in turn result from changes supplied by the user interface means.

5. A system as in claim 4 further comprising at least one synthesis tool connected to the control system and selectively connectable to the database change means for effecting changes to the information stored in the database means.

6. A system as in claim 2 further comprising a second plurality of sets of technology information each set selectively connectable to the database means for providing interpretations of the information stored in the database means in response to information from the user interface means.

7. In a computer-aided system for designing electrical circuits in which components are represented as nodes and interconnections among components as arcs, said arcs having at least one first type arc and at least one second type arc, and in which constraints on the design of the circuit are imposed solely on arcs, the constraints consisting of characterizing each arc as either rigid or Manhattan, a method of effecting changes to the circuit resulting from a change to a selected node comprising:
    (1) locating any of said at least one first type arc having both ends connected to the selected node;
    (2) changing said located first type arc;
    (3) repeating steps (1) and (2) until all until all of said at least one first type arc have been changed; then
    (4) locating any of said at least one second type arc having one end connected to the selected node and the other end connected to any other node ("other node"), the arc having a rigid constraint;
    (5) determining whether the other node has been changed, and if so, verifying the second type arc, otherwise;
    (6) changing the other node;
    (7) changing the arc between the selected node and the other node; and then
    (8) repeating steps (4)–(7) until all such second type arcs have been located.

8. A method as in claim 7 further comprising following step (8) the following steps:
    (9) locating any of the other nodes changed in step (6); and
    (10) repeating steps (1)–(8) until all such other nodes have been located.

9. A method as in claim 8 further comprising following step (10) the following steps:
    (11) locating any third type arc having one end connected to the selected node and the other end connected to another node ("another node"), the arc having a Manhattan constraint;
    (12) determining whether the another node has been changed, and if so verifying the third type arc, otherwise;
    (13) changing the another node;
    (14) changing the third type arc;
    (15) repeating steps (1)–(14) for the another node; then
    (16) repeating steps (11)–(15) until all such third type arcs have been located.

10. A method as in claim 9 wherein each of the steps of verifying the second type arc and verifying the third type arc comprise:
    determining whether the connection between the nodes between which the arc extends is invalid, and if so,
    generating an error signal.

11. In a system for designing electrical circuits in which collections of interconnected components are characterized as cells, each of said cells capable of having other instances, and interconnections among cells are characterized as arcs and arcs connect only to ports of cells, a method of propagating changes made in a selected cell to another cell comprising:

(1) changing the size of the selected cell;
(2) locating said other instances of the selected cell, thereby determining all instances of the selected cell, and if none are found ending the method, otherwise;
(3) determining both (a) whether said all instances of the selected cell are in a single larger cell and (b) whether any ports were moved by step (1), then and if (a) is true and (b) is false performing steps (4)–(6), otherwise performing steps (7)–(10);
(4) modifying said all instances;
(5) following the constraints on each arc connected to each instance modified at step (4);
(6) repeating steps (1)–(5) for the larger cell, then ending the method;
(7) erasing any marks on every cell;
(8) marking the selected cell with a flag;
(9) locating any other cell which has no other instances; and
(10) examining the cell located in step (9).

* * * * *